United States Patent
Ghannouchi et al.

(10) Patent No.: US 8,841,922 B2
(45) Date of Patent: Sep. 23, 2014

(54) PASSIVE SOURCE AND LOAD-PULL ARCHITECTURE FOR HIGH REFLECTION FACTOR SYNTHESIS

(76) Inventors: Fadhel M. Ghannouchi, Calgary (CA); Souheil Ben Smida, Bristol (GB); Mohammad Shabi Hashmi, Calgary (CA); Mohamed Helaoui, Calgary (CA)

(*) Notice: Subject to any disclaimer, the term of this patent is extended or adjusted under 35 U.S.C. 154(b) by 284 days.

(21) Appl. No.: 13/097,303

(22) Filed: Apr. 29, 2011

(65) Prior Publication Data

US 2011/0273187 A1 Nov. 10, 2011

Related U.S. Application Data

(60) Provisional application No. 61/333,134, filed on May 10, 2010.

(51) Int. Cl.
 *G01R 27/02* (2006.01)
 *G01R 27/32* (2006.01)

(52) U.S. Cl.
 CPC ..................................... *G01R 27/32* (2013.01)
 USPC .......................................... 324/605; 324/637

(58) Field of Classification Search
 CPC ....... G01R 27/02; G01R 31/2822; H01P 5/04
 USPC ................. 324/531–534, 623, 633, 637–646, 324/762.08, 762.09; 333/17.3, 139
 See application file for complete search history.

(56) References Cited

U.S. PATENT DOCUMENTS

| | | | | |
|---|---|---|---|---|
| 7,282,926 B1 * | 10/2007 | Verspecht et al. | ............ | 324/637 |
| 7,449,893 B1 * | 11/2008 | Tsironis | ........................ | 324/633 |
| 7,561,004 B1 * | 7/2009 | Tsironis | ........................ | 333/17.3 |
| 2001/0024117 A1 * | 9/2001 | Kiyokawa et al. | ......... | 324/76.49 |
| 2006/0087376 A1 * | 4/2006 | Young et al. | .................... | 330/286 |
| 2006/0139130 A1 * | 6/2006 | Boulerne | ...................... | 333/263 |
| 2007/0182424 A1 * | 8/2007 | Benedikt et al. | .............. | 324/637 |

* cited by examiner

*Primary Examiner* — Arleen M Vazquez
*Assistant Examiner* — Brent J Andrews

(57) ABSTRACT

An enhanced loop in a passive tuner consists of an extremely low loss coupler and a high directivity circulator. In the case of source reflection factor synthesis, a passive loop generates an additional incident traveling wave. This wave, added to the primary incident traveling wave, augments the traveling wave and thus increases the magnitude of the synthesized reflection factor at the source port of a device, such as a transistor. In the case of load reflection factor synthesis, the passive loop augments the initial reflected traveling wave by pumping an additional traveling wave. This additional traveling wave helps in synthesizing a higher load reflection factor at the load port. This architecture is capable of high reflection factor synthesis that enables load synthesis even on the border of the Smith chart. There is no problem of instability with the architecture of the present invention.

10 Claims, 3 Drawing Sheets

PASSIVE SOURCE AND LOAD-PULL ARCHITECTURE FOR HIGH REFLECTION FACTOR SYNTHESIS

CROSS-REFERENCE TO RELATED APPLICATIONS

This application claims the benefit of priority of U.S. provisional patent application No. 61/333,134, filed May 10, 2010, which is herein incorporated by reference.

BACKGROUND OF THE INVENTION

The present invention relates to passive source- and load-pull architecture for high reflection factor synthesis.

Modern design of high power microwave amplifiers, oscillators and other active components used in various communication systems requires accurate knowledge of the active device's (transistor's) characteristics. In such circuits, it is insufficient and inaccurate for the transistors operating at high power in their highly non-linear regions and close to saturation, to be described using analytical or numerical models. Instead the devices must be characterized using specialized test setups under the actual operating conditions.

A popular method for testing and characterizing such microwave components (transistors) for high power operation is "load pull" and "source pull", Load pull or source pull are measurement techniques employing wideband slide screw microwave tuners, RF signal sources, RF loads and other test equipment. The wideband microwave tuners in particular are used in order to manipulate the microwave impedance conditions under which the Device Under Test (DUT, or transistor) is tested.

As can be seen, there is a need for a novel passive source- and load-pull architecture for high reflection factor synthesis that does not require the time consuming calibration process of pre-matching.

SUMMARY OF THE INVENTION

In one aspect of the present invention, a passive architecture for synthesizing high reflection factor comprises a source-pull architecture which includes a RF source generator adapted to emit a traveling wave; a passive loop adapted to receive the traveling wave; a tuner adapted to reflect a portion of the traveling wave to be assembled by the passive loop, the tuner further adapted for superposition of the assembled traveling wave and the traveling wave; and a load-pull architecture which includes a load tuner adapted to reflect a portion of a load side traveling wave from a load port; a load side passive loop adapted to assemble a portion of the load side traveling wave.

In another aspect of the present invention, a passive architecture for synthesizing high reflection factor (reflective impedance factor) includes a RF source generator adapted to emit a traveling wave; a passive loop adapted to receive the traveling wave, the passive loop including a high directivity circulator, a low-loss directional coupler and a low-loss delay line; and a tuner adapted to reflect a portion of the traveling wave to be assembled by the passive loop, the tuner further adapted for superposition of the assembled traveling wave and the traveling wave.

In a further aspect of the present invention, a method for generating a high reflection factor in a passive source- and load-pull architecture includes generating a traveling wave by a RF source generator; passing the traveling wave to a tuner; reflecting a portion of the traveling wave to a passive loop; assembling the reflected portion of the traveling wave; superposing the assembled wave with the traveling wave with the tuner to deliver a high reflection factor (i.e., reflective impedance factor) to a source port.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, an embodiment of the present invention provides an enhanced loop in a passive tuner consisting of an extremely low loss coupler and a high directivity circulator. In the case of source reflection factor synthesis, the passive loop generates an additional incident traveling wave. This wave, added to the primary incident traveling wave, augments the traveling wave and thus increases the magnitude of the synthesized reflection factor at the source port of a device, such as a transistor. In the case of load reflection factor synthesis, the passive loop augments the initial reflected traveling wave by pumping an additional traveling wave. This additional traveling wave helps in synthesizing a higher load reflection factor at the load port. This architecture is capable of high reflection factor synthesis that enables load synthesis even on the border of the Smith chart. There is no problem of instability with the architecture of the present invention.

Figure 1:
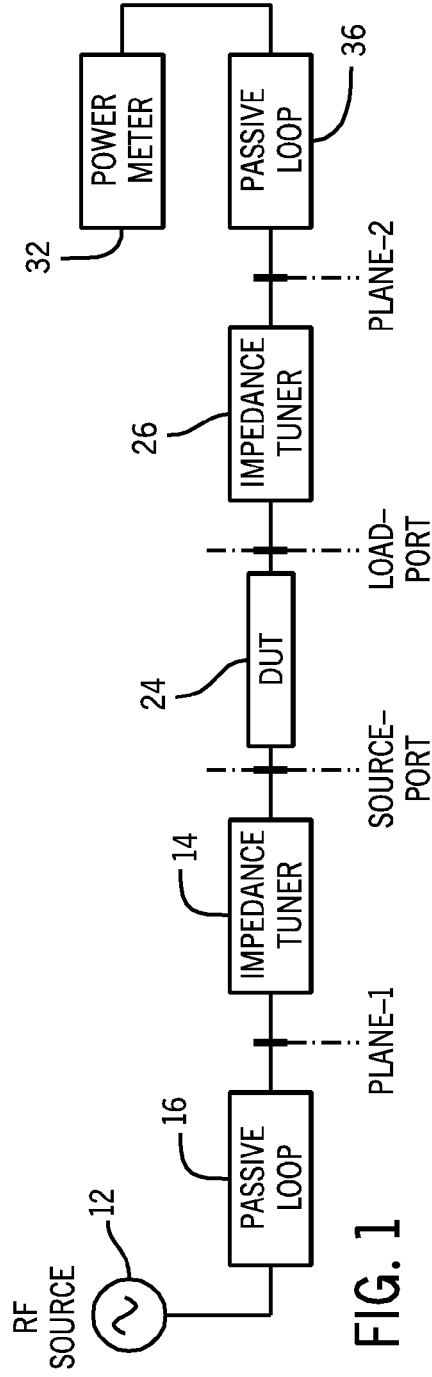
FIG. 1 is a block diagram of the architecture according to an exemplary embodiment of the present invention.
Figure 2:
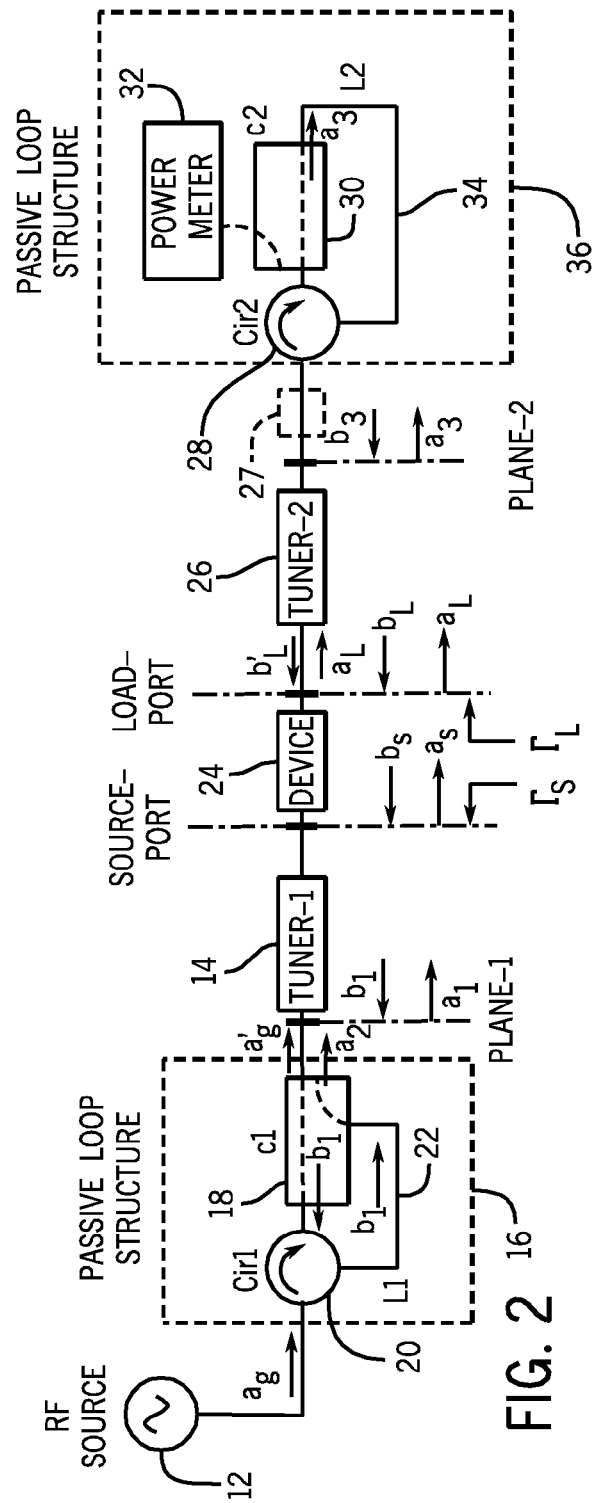
FIG. 2 is an electrical diagram of the architecture of FIG. 1.

Referring to FIGS. 1 and 2, a high reflection factor synthesis architecture may include an RF signal generator 12 that provides a signal to a passive loop 16 at a source tuner 14. The RF signal generator 12 may be any commercially available RF generator that can generate signals useful for the commercial mobile communication market. While there is no output power limitation on the RF signal generator 12, it typically provides output power in the range of 10-15 dBm. The source tuner 14 may be a traditional passive tuner that is capable of synthesizing a load reflection coefficient in a precise manner at a source port of a device 24. The source tuner 14 can be based on slide-screw technique, slug-based, or sub-based technique. The overall architecture of source tuner 14 could comprise of a single probe tuner, multiple-probe tuner, several cascade single-probe tuners, several cascaded multiple-probe tuners or any combinations of the these entities.

The passive loop 16 may provide a high reflection factor (i.e. reflective impedance factor, typically up to about a 0.98, for example) at the source port. The passive loop 16 may include an extremely low-loss directional coupler 18, a high directivity circulator 20 and an extremely low-loss variable delay line 22. The circulator 20 may be any available circulator, typically a ferrite-based or waveguide-based circulator. The variable delay line 22 could be a single delay line or could be a series combination of several delay lines as long as they provide low loss.

The device 24 may be a commercial transistor device capable of operating at RF and microwave frequencies. Typically, the device 24 may be either a Si-based or GaN or GaAs-based transistor.

A load tuner 26 may be an extremely low-loss passive tuner, such as a slide-screw type, a slug type, or a stub type tuner. The tuner 26 may be capable of synthesizing load reflection coefficient at the load port of the device 24.

A load tuner passive loop 36 may include a low-loss coupler 30, a high directivity circulator 28, a variable delay line 34, and a power meter 32. The coupler 30 could be any coupler applicable to the chosen operational frequency. The circulator 28 could be any circulator available in the market, typically a ferrite-based or a waveguide-based circulator. The variable delay line 34 could be a single cable or could be a series combination of several cables. The power meter 32 could be any commercial power measuring equipment available in the field.

At the source side, the passive loop 16 may be located in series between the RF signal generator 12 and the source tuner 14. While, on the load side, the load tuner 26 may be connected between the device 24 and the passive loop 36. The present invention may be configured in a manner different from that shown. For example, the positions of the components in the passive loops 16, 36 may be swapped. An optional switch and filter 27 may be present between the device 24 and the load tuner 26 to be able to extend the architecture for load reflection coefficient synthesis for wideband operation.

At the source side, the RF source generator 12 may generate a traveling wave, $a_g$, which may pass through the passive loop 16 and hit the tuner 14 in the form of a traveling wave $a_g'$. A part of this wave may be reflected and may be assembled by the low-loss passive loop 16. This assembled signal hits the tuner 14 in the form of a traveling wave $a_2$. The superposition of traveling waves $a'_g$ and $a_2$ together may pass through the tuner 14 and may help in synthesizing a higher magnitude source reflection coefficient at the source port $\Gamma_s$.

At the load side, the reflected traveling wave $b_L$ at the load-port may be the result of the contribution of two waves. The first contributing wave $b'_L$ may result from the reflection of the wave $a_L$ by the load tuner 26. The second contributing wave $b_3$ may pass through the load tuner and may augment the reflected traveling wave at the load port. The combinations of the traveling waves may raise the overall magnitude of the reflected traveling wave $b_L$ at the load port. The increase in the magnitude of the reflected traveling wave may help in increasing the magnitude of the achieved reflection factor $\Gamma_L$ at the load port, The source-pull architecture (source side of the architecture 10) can be used alone for the purpose of high reflection factor at the source port, for source matching, of the device 24. The load-pull architecture (load side of the architecture 10) can be used for the purpose of high reflection factor at the load port, for load matching, of the device 24.

Figure 3:
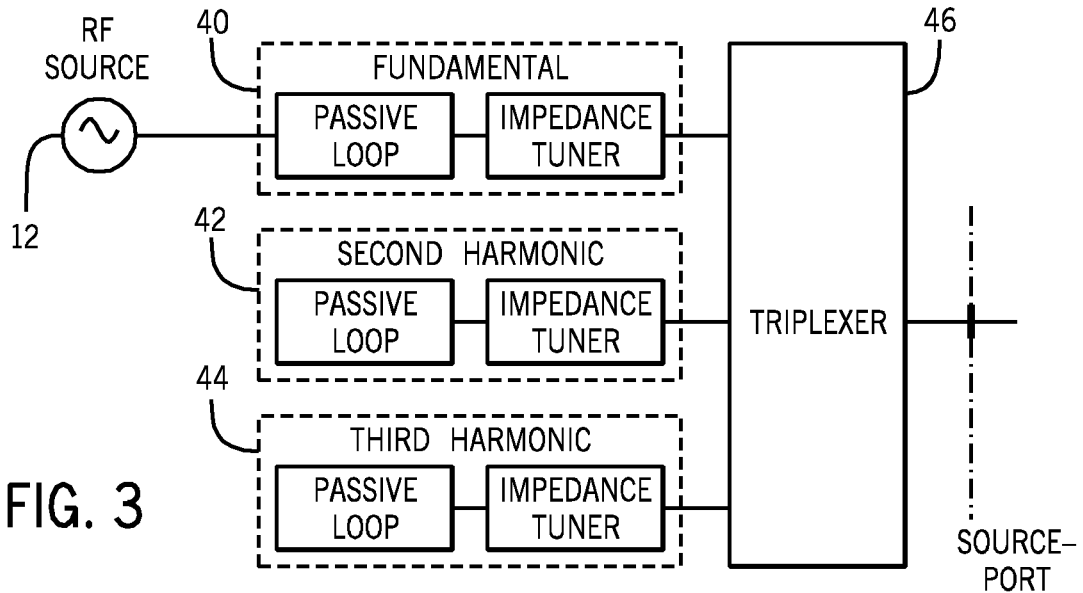
FIG. 3 is a block diagram of a source side architecture according to another embodiment of the present invention.
Figure 4:
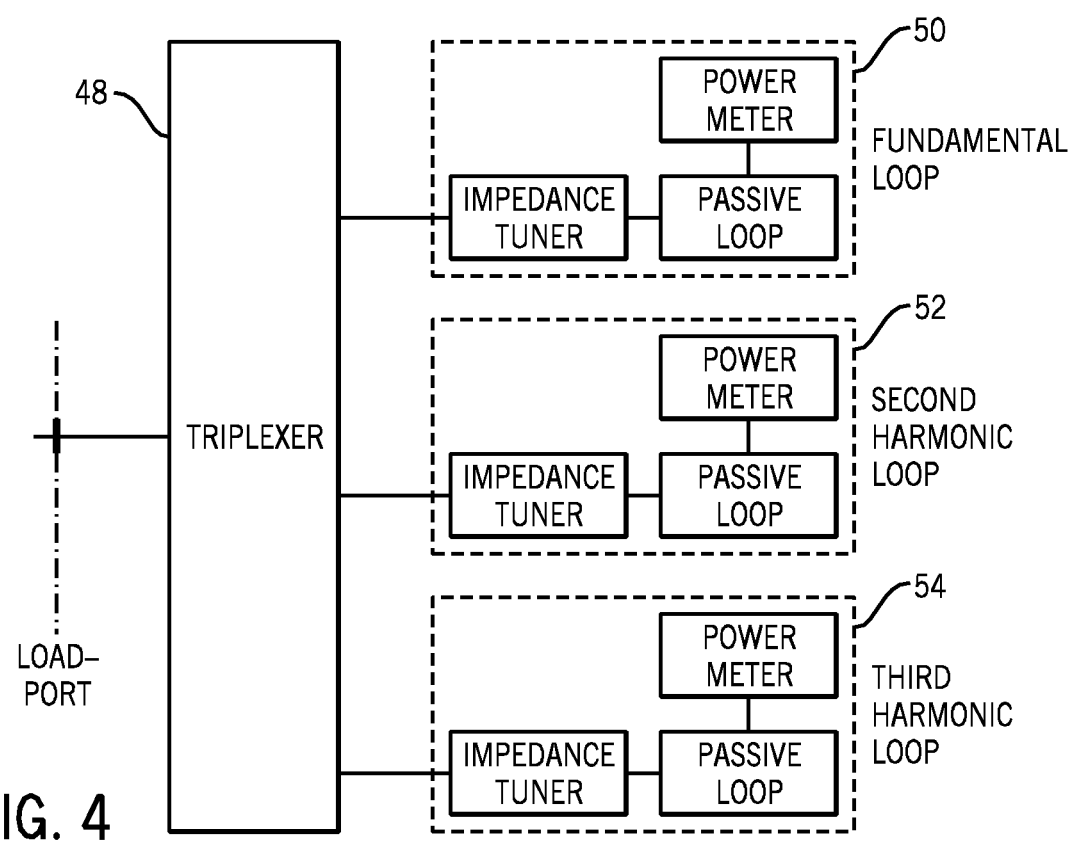
FIG. 4 is a block diagram of a load side architecture according to another embodiment of the present invention.

As shown in FIGS. 3 and 4, the source-pull and load-pull architectures may be used for fundamental as well as harmonic tuning applications. For example, as shown in FIG. 3, the signal from the RF source generator passes through the fundamental loop 40. A second harmonic loop 42 and a third harmonic loop 44 may assemble and feedback harmonic components generated at the source port of the device 24. These feedback harmonic components, along with the RF signal passing through the fundamental loop 40 may be rejoined by a triplexer 46 prior to reaching the source part of the device 24.

As shown in FIG. 4, a fundamental loop 60, a second harmonic loop 52 and a third harmonic loop 54 may each include a power meter (e.g., power meter 32), a passive loop (e.g., passive loop 36) and a tuner (e.g., tuner 26). A triplexer 48 may join the fundamental and harmonics prior to the load port of the device 24. The power meter 32 may be optional in the second harmonic loop 52 and the third harmonic loop 54.

To use the invention, the user can use sensing couplers at the source and the load ports to collect the respective incident and reflective waves at both ports. Then, the ratio of the incident and reflective waves can provide information about the synthesized reflection coefficients at both the source and load ports. The source and load reflection factors could then be used to estimate the impedances at the source and load ports, respectively by the following formulas:

$$rS = Zs - Z0 \text{ divided by } Zs + Z0$$

$$rL = ZL - Z0 \text{ divided by } ZL + Z0$$

where rS and rL are the synthesized source and load reflection factors, Zo is the system characteristic impedance (which is usually 50), ZL and Zs are the estimated impedances at the load and source ports of the device, respectively.

Figure 5:
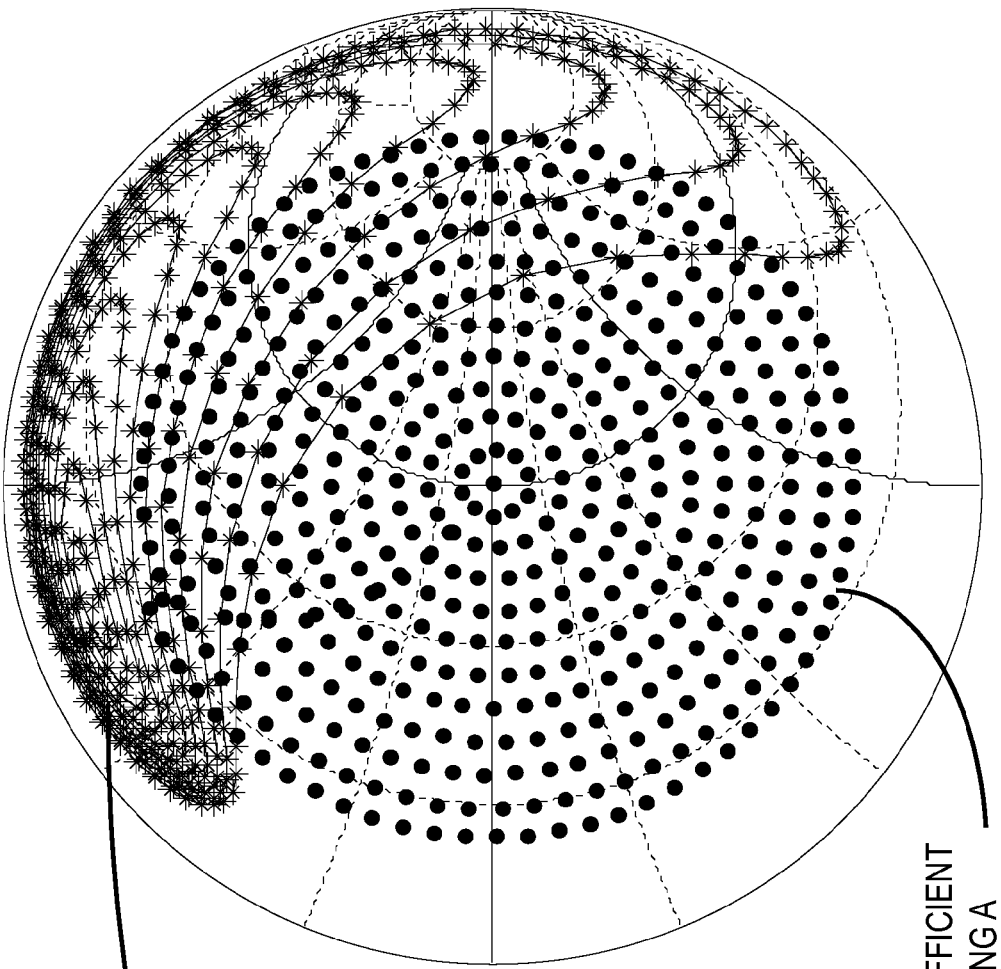
FIG. 5 is a pictorial representation of reflection coefficients comparing the present invention to convention apparatus.

The existing passive impedance synthesis approaches cannot synthesize the reflection factor close to the border of the Smith chart due to the inherent losses in the tuner as well as in the associated passive networks/cabling between the system and the device being characterized. In practical situations, the losses limit the reflection factor up to a maximum of about 0.92. However, with the present invention, having an added loop at the end of the passive tuner, an additional traveling wave is provided which adds with the primary traveling wave to raise the achievable reflection factor up to about 0.98 as shown in FIG. 5. The present invention may behave like a resonating structure because it benefits from a constructive superposition of traveling waves which is not the case in the existing passive impedances synthesis approaches.

It should be understood, of course, that the foregoing relates to exemplary embodiments of the invention and that modifications may be made without departing from the spirit and scope of the invention as set forth in the following claims.

What is claimed is:

1. A passive architecture for synthesizing high reflective impedance factor, the architecture comprising:
    a source-pull architecture including:
        a RF source generator adapted to emit an input traveling wave at a testing frequency;
        a closed passive loop adapted to receive the input traveling wave and to also feed-forward the input traveling wave to a device under test (DUT) through a tuner and to then send back to the DUT a portion of the reflected input traveling wave through the tuner as a supplementary traveling wave at the same testing frequency to be assembled to the input traveling wave;
        the tuner adapted to send the portion of the reflected input traveling wave to be assembled by the passive loop as a supplementary traveling wave, the tuner further adapted to present a high magnitude reflection coefficient to the DUT by the superposition of the supplementary traveling wave and the input traveling wave; and a load-pull architecture including:
- a load tuner adapted to reflect to the DUT a portion of an output travelling wave at the testing frequency coming out from the DUT;
- a load side closed passive loop adapted to first receive a portion of the output traveling wave through the load tuner and, second, to send back a supplementary travelling wave to the DUT through the load tuner.

2. The architecture of claim 1, wherein the passive loop comprises a high directivity circulator, a low-loss directional couple and a low-loss delay line as well as other possible accessorial components.

3. The architecture of claim 1, wherein the load side passive loop comprises a high directivity circulator, a low-loss directional coupler and a low-loss delay line as well as other possible accessorial components.

4. The architecture of claim 1, further comprising a power meter in the load side passive loop.

5. The architecture of claim 1, further comprising a source port and the load port for receiving the device under test.

6. The architecture of claim 5, wherein the device under test is a transistor.

7. The architecture of claim 5, further comprising;
load-pull architectures for each harmonic; and
a multiplexer disposed between the DUT and the load-pull architectures.

8. The architecture of claim 5, further comprising;
passive loops for each harmonic; and
a multiplexer disposed between the load tuner and the passive loops.

9. A passive architecture for synthesizing high reflective impedance factor, the architecture comprising;
- a RF source generator adapted to emit an input traveling wave;
- a closed passive loop adapted to receive the input traveling wave, the passive loop including a high directivity circulator, a low-loss directional coupler and a low-loss delay line; and
- a tuner adapted to send a portion of the traveling input wave reflected by the DUT to be assembled by the passive loop as a supplementary traveling wave, the tuner further adapted for superposition of the supplementary traveling wave and the input traveling wave.

10. A method for generating a high reflective impedance factor in a passive source-and/or load-pull architecture, the method comprising;
generating an input traveling wave by a RF source generator;
passing the input traveling wave to a tuner;
reflecting a portion of the input traveling wave by DUT to a closed passive loop;
assembling the reflected portion of the input traveling wave as a supplementary traveling wave; and
superpositioning the assembled supplementary traveling wave with the input traveling wave with the tuner to deliver a high reflective impedance factor to the DUT.

* * * * *